(12) United States Patent
Qiu et al.

(10) Patent No.: US 9,443,740 B1
(45) Date of Patent: Sep. 13, 2016

(54) PROCESS FOR FORMING GATE OF THIN FILM TRANSISTOR DEVICES

(71) Applicants: Cindy X. Qiu, Brossard (CA); Kuang-Yu Yang, Zhunan (TW); Ishiang Shih, Brossard (CA); Lu Han, Brossard (CA); Chunong Qiu, Brossard (CA); Julia Qiu, Brossard (CA); Andy Shih, Brossard (CA); Yi-Chi Shih, Los Angeles, CA (US)

(72) Inventors: Cindy X. Qiu, Brossard (CA); Kuang-Yu Yang, Zhunan (TW); Ishiang Shih, Brossard (CA); Lu Han, Brossard (CA); Chunong Qiu, Brossard (CA); Julia Qiu, Brossard (CA); Andy Shih, Brossard (CA); Yi-Chi Shih, Los Angeles, CA (US)

( * ) Notice: Subject to any disclaimer, the term of this patent is extended or adjusted under 35 U.S.C. 154(b) by 0 days.

(21) Appl. No.: 14/545,516

(22) Filed: May 15, 2015

(51) Int. Cl.
| | | |
|---|---|---|
| H01L 21/027 | (2006.01) | |
| H01L 21/8232 | (2006.01) | |
| H01L 21/3065 | (2006.01) | |
| H01L 21/32 | (2006.01) | |
| H01L 21/321 | (2006.01) | |
| H01L 21/3105 | (2006.01) | |
| H01L 21/285 | (2006.01) | |
| H01L 21/3205 | (2006.01) | |

(52) U.S. Cl.
CPC ..... *H01L 21/30655* (2013.01); *H01L 21/0272* (2013.01); *H01L 21/0274* (2013.01); *H01L 21/0276* (2013.01); *H01L 21/28512* (2013.01); *H01L 21/28587* (2013.01); *H01L 21/3105* (2013.01); *H01L 21/32* (2013.01); *H01L 21/321* (2013.01); *H01L 21/32051* (2013.01)

(58) Field of Classification Search
USPC .......................................... 438/182, 577, 579
See application file for complete search history.

(56) References Cited

U.S. PATENT DOCUMENTS

| | | | | |
|---|---|---|---|---|
| 4,337,115 A * | 6/1982 | Ikeda | .................. | H01L 21/0272 257/640 |
| 4,341,850 A * | 7/1982 | Coane | ................. | H01L 21/0272 257/E21.025 |
| 6,387,783 B1 * | 5/2002 | Furukawa | ......... | H01L 29/42316 257/E21.173 |
| 8,324,037 B1 * | 12/2012 | Shih | .................. | H01L 29/42316 257/194 |
| 8,455,312 B2 * | 6/2013 | Qiu | ................... | H01L 21/28587 438/182 |
| 2005/0202613 A1 * | 9/2005 | Pellens | ............. | H01L 21/28587 438/167 |

* cited by examiner

*Primary Examiner* — Stephen W Smoot

(57) ABSTRACT

A process for forming a T-gate with enhanced mechanical strength and a reduced gate length for high electron mobility transistors is provided. The process includes the steps of forming a stem portion cavity with rounded top edges to enhance the mechanical strength, creating an insoluble diffused feature shrinking layer to reduce the gate length, carrying out a thermal flow process to further reduce the gate length, and forming a head portion cavity with negative side wall slopes to facilitate lift-off of gate metal layers.

22 Claims, 8 Drawing Sheets

110a

110b

110c

110d

110e

PROCESS FOR FORMING GATE OF THIN FILM TRANSISTOR DEVICES

FIELD OF INVENTION

This invention relates to a process for fabricating transistor devices and more specifically relates to process for forming T-gates for high electron mobility transistors for millimeter wave integrated circuits. In particular, this invention relates to forming small patterns for gate stem portion by forming a feature shrinking layer such as RELACS polymer on side walls of a photoresist, removing un-diffused portion of the feature shrinking layer and performing a thermal flow to form a small gate stem portion cavity.

BACKGROUND OF THE INVENTION

For microwave integrated circuits or millimeter wave integrated circuits, herein after called MMICs, transistor devices with sufficient gains at high frequencies are required. Two device configurations have been developed and used in two different MMIC technologies: high electron mobility transistor (HEMT) and hetero junction bipolar transistor (HBT). Both are based on compound semiconductors such as InGaAs, InGaN and GaN. MMICs based on HEMT or HBT are fabricated on wafers or substrates with epitaxial layers specifically designed for each technology. The present invention relates to fabrication of HEMT devices for MMICs applications and the following description will be focused on the HEMT processes and structures.

For HEMTs in MMICs applications, a maximum operating frequency, $f_{max}$ is defined as the frequency when the gain of the device is reduced to 1. In general, the value of $f_{max}$ is determined by gate length and charge carriers mobility in the channel layer, which could be InGaAs, InGaN or GaN. FIGS. 1A-1E show cross-sectional views of gate structures (100a, 100b, 100c, 100d and 100e) for HEMTs. Each of the structures is shown to have a gate stem portion (110S) and a head portion (110H) sitting on a semiconductor substrate (105), except for (110a) which has only one stem-like portion (110S'). For commonly adopted epitaxial layer structure with an InGaAs channel or GaN channel in HEMTs for X-band or Ka-band MMIC applications, the gate length, $L_s$ (see FIG. 1A) required is 0.15 µm. For operation at higher frequencies, HEMTs with a gate length $L_s$ of 0.1 µm or less are required.

For a simple rectangular gate structure (110a) shown in FIG. 1A which has a cross-sectional area of $L_s \times H_s$ with $H_s$ as the height of the simple rectangular gate (110S'), the series resistance associated with the gate, $R_s$ in the direction perpendicular to the cross-section (or along the width of the gate) is often too high so that the resulted $R_s C$ value is too large and will limit the operating frequency, where C is the capacitance associated with the gate or the capacitance between the gate (110S') and the semiconductor substrate (105). Therefore, the maximum operating frequency $f_{max}$ will be limited by this $R_s C$ constant rather than by the transit time of charge carriers across the semiconductor channel under the gate. Since a short gate length $L_s$ is required to achieve high operation frequencies, fabrication of HEMTs with such a short gate length $L_s$ is thus challenging due to the need to maintain a low enough unwanted series resistance $R_s$ for the gate.

Several improved gate configurations have been developed and adopted, including: a T-gate structure (110b, see FIG. 1B) and a inverted L or Γ-gate structure (110c, FIG. 1C). There is also a Y-gate structure which is similar to the T-gate structure. All three gate structures have a gate stem portion (110S) and a gate head portion (110H) and all have one common feature: the length of the stem portion or the gate length, $L_s$, is fabricated to be small: either 0.25 µm, 0.15 µm or less for high frequency operation. It is thus clear that in subsequent description, the above three gate configurations: T-gate, Y-gate or Γ-gate will be commonly called a T-gate for simplification of the descriptions.

These T-gate structures can be divided into two portions: the gate stem portion (110S) which is similar to the simple gate (100S') shown in FIG. 1A and the head portion (110H). The stem portion of the gate has a stem portion length, $L_s$ and a stem portion height, $H_s$ whereas the head portion of the gate has a head portion length, $L_h$ and a head portion height $H_h$, so that the cross-sectional area of the head portion $L_h \times H_h$ is substantially greater than the cross-sectional area of the stem portion $L_s \times H_s$. The total cross-sectional area of the T-gate is equal to $L_h \times H_h + L_s \times H_s$ which is much greater than the cross-sectional area of the simple gate (110S'): $L_s \times H_s$ and thus leads to a much smaller unwanted series gate resistance. Although there will be an increase in the unwanted capacitance C due to the incorporation of the head portion of the gate, this capacitance increase rate is less than the decrease rate of the unwanted series gate resistance due to the head portion. As a result, the unwanted series resistance and capacitance product $R_s C$ associated with the T-gate structure is much smaller than that associated with the simple gate structure (110S') shown in FIG. 1A, and a large maximum operation frequency $f_{max}$ can be achieved.

The gate stem portion (100S) makes direct contact to the semiconductor substrate (105), which has a channel layer and a barrier layer to obtain low transit time and small junction capacitance C. In HEMT devices for low frequency applications such as power switching or amplification, the gate stem portion length (or the gate length) $L_s$ may be larger than 0.25 µm.

In micro-lithography, the main parameters to achieve patterns or features with a given resolution, R, are light wavelength, and numerical aperture NA of the projection lens: $R = k_1 [\lambda/NA]$. Here $k_1$ is a process-related factor and is preferred to be as small as possible to achieve a high resolution. However, smaller $k_1$ values will require very strict control of the processing parameters and is more difficult to achieve with high yield. Typical values of $k_1$ are 0.3~0.45. Currently, light sources for lithography include i-line UV source at 365 nm, KrF DUV laser at 248 nm and ArF DUV laser at 193 nm. The lithography processes may be divided into three categories: above-wavelength, $R > \lambda$, near wavelength $R \sim \lambda$ and sub-wavelength $R < \lambda$. Although the micro-lithography technologies have been developed extensively on silicon fabrication with sub-wavelength resolution, they are still insufficient for manufacturing compound semiconductor devices for MMICs. This is mainly because devices for the MMICs, specifically HEMTs require a T-gate structure to achieve high maximum operation frequency, $f_{max}$. The fabrication of a T-gate requires a polymeric photoresist mold which needs to meet strict structural and parameter requirements to obtain electrical performance and high yield. Current main production of MMICs involving HEMTs is achieved using an e-beam lithography process to form molds for the T-gates. However, production of wafers using e-beam lithography is less cost effective due to the low throughput compared to optical steppers or optical scanners.

Using an optical lithography to fabricate T-gates for HEMTs, two or three layers of photoresist may be used. As shown in FIGS. 1B and 1C, by using the conventional photolithography process, the transition from the gate stem portion (110S) to the gate head portion (110H) is usually abrupt and sharp (the sharp corners are indicated by AB in FIG. 1B and FIG. 1C). In order to enhance the mechanical strength, it is preferable to have a more smooth or gradual transition between the stem portion and the head portion in a gate. FIGS. 1D and 1E show schematic cross-sections of T-gates with a smooth and gradual transition, as indicated as SM in the figures, from the gate stem portion (100S) to the gate head portion (100H) to enhance the mechanical strength of the T-gate structures. Such smooth and gradual transition in the T-gate structures has been achieved by a thermal flow process for the first photoresist after the formation of the first cavity for forming the gate stem portion. However, the thermal flow process of photoresist to obtain the smooth or gradual transition between the gate stem portion and the gate head portion is difficult to control and even more difficult to achieve uniform yield in MMICs productions.

Therefore, it would be beneficial to have a improved process for forming T-gates for HEMTs in MMICs applications.

SUMMARY OF THE INVENTION

One objective of the invention is to provide a process for forming a T-gate with enhanced mechanical strength for a high electron mobility transistor. This process includes the steps of forming a stem portion cavity with rounded top edges to improve the mechanical strength, and forming a head portion cavity with negative side wall slopes to facilitate life-off of gate metal layers.

Another objective of the invention is to provide a process for forming a T-gate with enhanced mechanical strength and a reduced gate length for a high electron mobility transistor. The process includes the steps of forming a stem portion cavity with rounded top edges to improve the mechanical strength, creating a insoluble diffused feature shrinking layer to reduce the gate length, and forming a head portion cavity with negative side wall slopes to facilitate life-off of gate metal layers.

Yet another objective is to provide a process for forming a T-gate with enhanced mechanical strength and a reduced gate length for a high electron mobility transistor. The process includes the steps of forming a stem portion cavity with rounded top edges to improve mechanical strength, creating an insoluble diffused feature shrinking layer to reduce the gate length, carrying out a thermal flow process to further reduce the gate length and forming a head portion cavity with negative side wall slopes to facilitate life-off of gate metal layers.

BRIEF DESCRIPTION OF THE SEVERAL VIEWS OF THE DRAWINGS

FIG. 1A a simple rectangular gate 100S' having a gate length $L_s$ and a gate height $H_s$ on a semiconductor (105); FIG. 1B a T-gate with a gate heat portion, a gate stem portion, and a sharp transition (AB) from the stem portion to the head portion; FIG. 1C a Γ-gate with a gate heat portion, a gate stem portion, and a sharp transition (AB) from the stem portion to the head portion; FIG. 1D a T-gate with a smooth transition (SM) from the gate stem portion to the gate head portion; and FIG. 1E a Γ-gate with a smooth transition (SM) from the gate stem portion to the gate head portion.

FIG. 2A after application, exposing and developing a first photoresist layer forming a first stem portion cavity (215); FIG. 2B after application, exposing and developing a second photoresist layer forming a head portion cavity (225); FIG. 2C after vacuum deposition of gate metal layers (250, 250-1, 250-2); FIG. 2D after lift-off process to form the T-gate (250); FIG. 2E after deposition of a passivation layer; FIG. 2F with an inclusion of an adhesion layer (270) and an anti-reflection layer (280); and FIG. 2G with the application of a third photoresist layer (290).

FIG. 3A with a small first defocus value which yields a small radius of curvature $R_1$ in the upper edge of the first photoresist layer; FIG. 3B with a medium first defocus value which yields a medium radius of curvature $R_2$ in the upper edge of the first photoresist layer; FIG. 3C with a large first defocus value which yields a large radius of curvature $R_3$ in the upper edge of the first photoresist layer; and FIG. 3D with a medium first defocus value and with a second photoresist layer for forming a head portion cavity, where a second defocus value is selected to yield negative slops in side walls of the second photoresist layer.

FIG. 4A after application, exposing and developing a first photoresist layer forming a first stem portion cavity (415-1); FIG. 4B after application of a feature shrinking layer (460); FIG. 4C after a diffusion bake to form a diffused feature shrinking layer (465); FIG. 4D after removal of unaffected portion of the feature shrinking layer; FIG. 4E a simplified view to show a combined first photoresist layer and the diffused feature shrinking layer (410C); FIG. 4F after application, exposing and developing a second photoresist layer (420) forming a head portion cavity (425); FIG. 4G after vacuum deposition of gate layers (450, 450-1, 450-2); FIG. 4H after lift-off of unwanted gate metal layers (450-1, 450-2); FIG. 4I after deposition of a passivation layer (430, 430-1 and 430-2); FIG. 4J with the inclusion of an adhesion layer (470) and an anti-reflection layer (480); and FIG. 4K with the application of a third photoresist layer (490) to create overhang.

FIG. 5A after application, exposing and developing a first photoresist layer forming a first stem portion cavity (515-1) having a first stem portion cavity length $L_{S1}$; FIG. 5B after application of a feature shrinking layer (560); FIG. 5C after a diffusion bake to form a diffused feature shrinking layer (565); FIG. 5D after removal of un-diffused portion of the feature shrinking layer to form a second stem portion cavity (515-2) having a second portion cavity length $L_{S2}$; FIG. 5E after a thermal flow to yield a third stem portion cavity (515-3) having a third stem portion cavity length $L_{S3}$; FIG. 5F after application, exposing and developing a second photoresist layer (520) forming a head portion cavity (525); FIG. 5G after vacuum deposition of gate metal layers (550, 550-1, 550-2); FIG. 5H after lift-off of unwanted metal layers (550-1, 550-2); FIG. 5I after deposition of a passivation layer (530, 530-1, 530-2); FIG. 5J with inclusion of an adhesion layer (570) and an anti-reflection layer (580); and FIG. 5K with the application of a third photoresist layer (590) to create overhang.

DETAILED DESCRIPTION OF THE PREFERRED EMBODIMENTS

Figure 1A:
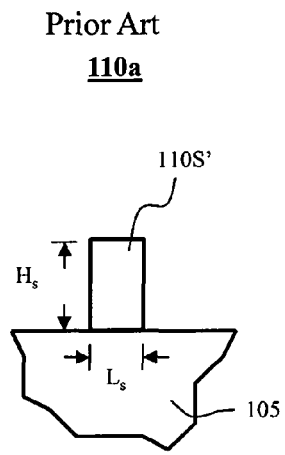
FIGS. 1A-1E show schematic cross-sectional views of different gate structures.
Figure 1B:
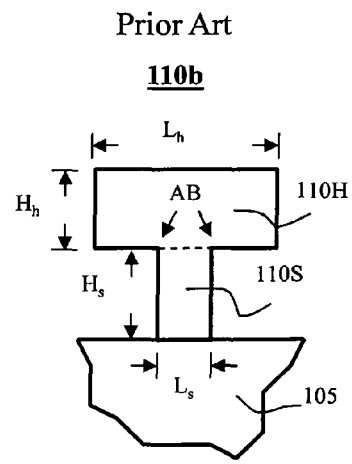
Figure 1C:
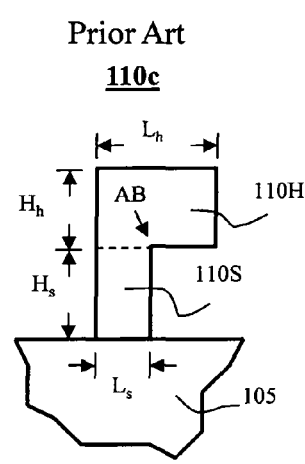
Figure 1D:
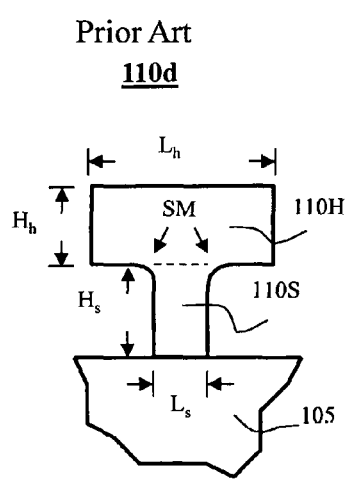
Figure 1E:
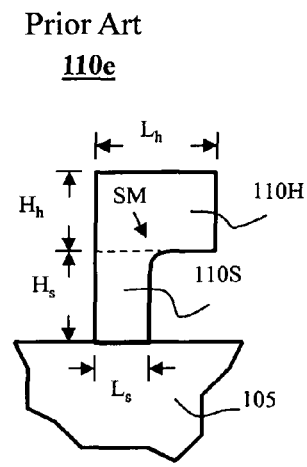
Figure 2A:
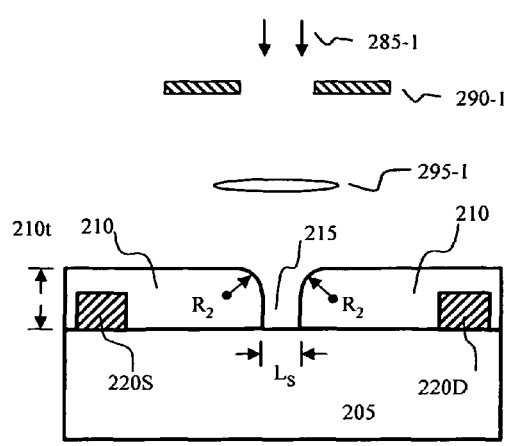
FIGS. 2A-2G show schematic cross-sectional views of a semiconductor substrate (205) at different fabrication stages.
Figure 2B:
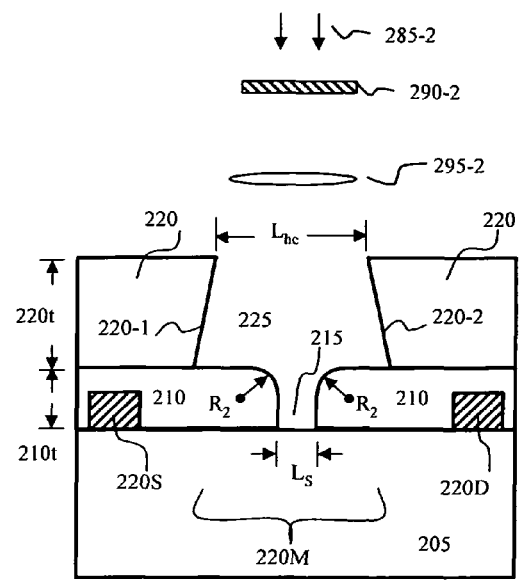
Figure 2C:
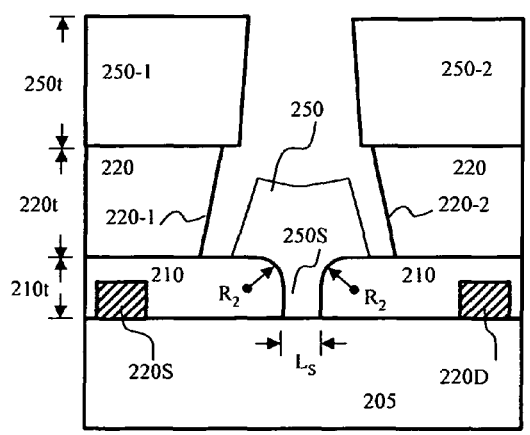
Figure 2D:
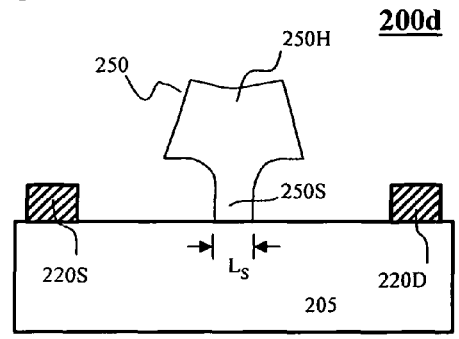

T-Gates Formed with Two Defocus Values:

According to one embodiment of the present invention and as shown in FIGS. 2A-2G, a process for forming a T-gate (250) with gradual transitions between the stem portion and the head portion for a transistor device (200d, shown in FIG. 2D) on a semiconductor substrate (205) having a source (220S) and a drain (220D) is provided. This process comprises the following steps:

(1) forming a first photoresist layer (210, FIG. 2A) of a first photoresist type (preferably a positive type) to a first photoresist layer thickness (210t) on the semiconductor substrate (205) and performing first soft baking of the first photoresist layer;

(2) carrying out a first defocusing to allow a deviation from accurate focus for image of a first mask pattern on a first mask (290-1) by a first light source (285-1) through a first lens (295-1) onto the first photoresist layer (210) for a selected first defocus value, DF1, wherein amount of the first defocus value (defined as a deviation from accurate focus or a difference in distance between the focused image of the first mask pattern and the center position of the first photoresist layer) DF1 is preferably selected as negative and in a range of −0.35 μm to −1.2 μm and is more preferably selected in a range of −0.45 μm to −0.9 μm in order to obtain rounded top edges for the first photoresist layer after a subsequent first developing;

(3) exposing the first photoresist layer (210) by the first light source (285-1, FIG. 2A) through the first mask (290-1) and the first lens (295-1);

(4) performing a first baking of the first photoresist layer (210), developing and rinsing of the first photoresist layer to form a stem portion cavity (215, as shown in FIG. 2A) with a stem portion cavity length $L_s$ in the first photoresist layer (210). The stem portion cavity (215) has rounded top edges with curvatures of radius $R_2$;

(5) performing first hard baking of the developed first photoresist layer or a plasma hardening process;

(6) forming a second photoresist layer (220, FIG. 2B) of a second photoresist type and a second photoresist layer thickness (220t) on the first photoresist layer (210) and the semiconductor substrate (205);

(7) performing second soft baking of the second photoresist (220);

(8) carrying out a second defocusing for image of a second mask pattern on a second mask (290-2) by a second light source (285-2) through a second lens (295-2) onto the second photoresist layer (220) for a selected second defocus value, DF2, wherein amount of the second defocus value DF2 (defined as the difference in distance between the focused image of the second mask pattern and the center position of the second resist layer) is preferably selected as negative and in a range of −0.35 μm to −1.5 μm and is more preferably selected in a range of −0.45 μm to −1.2 μm in order to obtain negative slopes for head portion cavity side walls (220-1 and 220-2, shown in FIG. 2B) in the second photoresist layer (220) after a second developing;

(9) exposing the second photoresist layer to the second light source (285-2) through the second mask (290-2) with head portion cavity patterns and through the second lens (295-2);

(10) performing second post exposure baking of the second photoresist layer, developing and rinsing of the second photoresist layer to form a head portion cavity (225) having a head portion cavity length ($L_{hc}$, shown in FIG. 2B) in the second photoresist layer (220);

(11) performing a second hard baking or more preferably a plasma hardening of the developed second photoresist layer;

(12) depositing gate metal layers (250, 250-1, 250-2, FIG. 2C) with a thickness (250t) by a vacuum deposition method;

(13) performing lift-off to remove the gate metal layers (250-1, 250-2) on the second photoresist layer and removing the first photoresist layer and the second photoresist layer;

(14) rinsing and baking to complete the fabrication steps for forming a HEMT device (200d) having a T-gate with gradual transitions between the stem portion and the head portion, as shown in FIG. 2D.

In above processes, the first light source (285-1) and the second light source (285-2) are selected from a group including an i-line UV light source at 365 nm, a KrF DUV laser at 248 nm and an ArF DUV laser at 193 nm.

According to this invention, during the imaging of the second photoresist layer (220), in order to prevent interference in the overlapping portion of the first photoresist layer (210) and the second photoresist layer (220) in the second masking area (220M, FIG. 2B) which defines the head portion cavity (225), the second photoresist type is preferably chosen to be negative, which is opposite to the first photoresist type. Therefore, the region in the second photoresist layer to form the head portion cavity (225) will be blocked by the opaque second mask pattern (290-2) and will not be exposed to the second light source (285-2) so that it can be removed during the developing. The second light source also will not reach the first photoresist portions overlapping the second masking area (220M, FIG. 2B) and the integrity of the stem portion cavity (215) will be retained during the developing of the second photoresist layer. Contrarily, if the second light source (285-2) is allowed to illuminate the second photoresist layer (220) in the head portion cavity (225), a portion of the second light will reach the first photoresist layer overlapping the second masking area (220M). Due to this undesirable illumination of second light on the first photoresist overlapping portions, the integrity of stem cavity (215) defining by the first photoresist (210) will degrade during the second developing of the second photoresist layer which forms the head portion cavity (225).

Figure 2E:
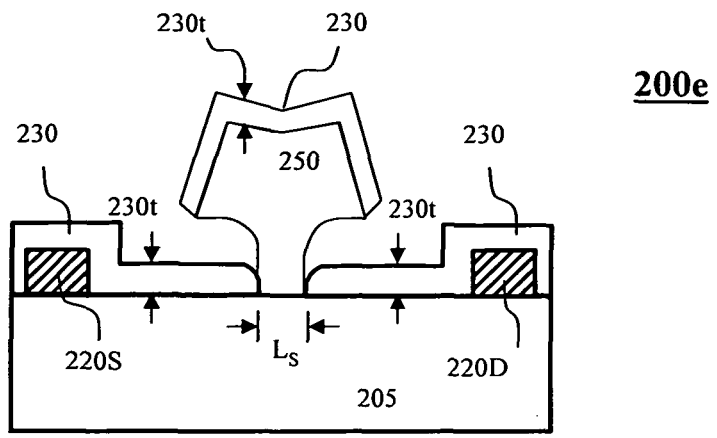
Figure 2F:
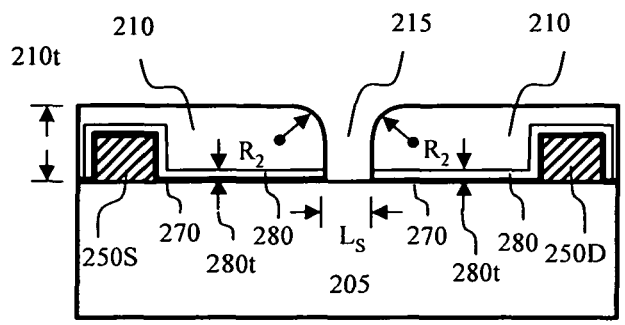

After the final rinsing and baking following the lift-off process of the gate metal layers (250), the HEMT device (200d, FIG. 2D) is ready for testing. In order to improve thermal stability and reliability of the HEMT device (200d) and as shown in FIG. 2E, a passivation layer (230) with a passivation layer thickness (230t) may be deposited on top of the device to form HEMT device (200e). Material of the passivation layer (230) is selected from a groups of: silicon oxide, silicon nitride hafnium oxide, aluminum oxide and their mixtures.

According to one other embodiment of this invention, the first photoresist layer (210) and the second photoresist layer (220) are hardened after development and rinsing by a photoresist hardening process. This photoresist hardening process uses a method including: thermal baking, IR irradiation and plasma treatment.

In order to enhance adhesion of the first photoresist layer (210) to the semiconductor substrate (205), a thin layer of primer (270, see FIG. 2F) is applied onto the semiconductor substrate (205) prior to the application of the first photoresist layer (210). Such primer layer (270) maybe be applied by spin coating or by vapour deposition and is preferably a material of hexamethyldisilazane.

In order to minimize the unwanted reflection of the first light from the first light source (285-1) during exposure or imaging of the first photoresist layer (210), a first antireflection layer (280 in FIG. 2F) is applied prior to the application of the first photoresist layer. The thickness of the first antireflection layer (280t) is selected so that a minimized amount of reflected first light (285-1) from the semiconductor substrate (205) is achieved and the resolution of the stem portion cavity (215) in the first photoresist layer is enhanced.

Figure 2G:
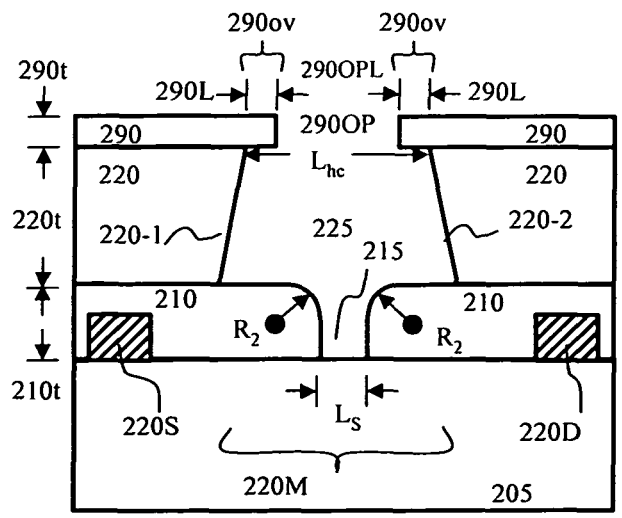

According to another embodiment of this invention, the definition of a head portion cavity (225) for a T-gate may well be achieved by having a third photoresist layer (290) as shown in FIG. 2G. After the application of the second photoresist layer (220) and performing a second photoresist layer soft baking but before being exposed to the second light source through the second mask, a third photoresist layer (290) with a third photoresist type and a third photoresist layer thickness (290t) is applied. The third photoresist type is the same as the second photoresist type so that they can be exposed in same second exposure process. This is followed by a third photoresist soft baking. After the third photoresist soft baking, a second exposure using the second light source (285-2) through a second mask (290-2) as depicted in FIG. 2B is performed. The second light source (285-2) will expose both the second photoresist layer (220) and the third photoresist layer (290). According to an embodiment of this invention, the developing sensitivity of the third photoresist layer (290) is smaller compared to developing sensitivity of the second photoresist layer (220), so that after a second developing, a head portion cavity (225) will be created in the second photoresist layer having a head portion cavity length $L_{hc}$. Due to the lower developing sensitivity of third photoresist layer (290), a third photoresist opening (290OP) with a third photoresist layer opening length (290OPL) and a third photoresist overhang (290ov) of a third photoresist overhang length (290L) is created. The third photoresist layer opening length (290OPL) is slightly smaller than the head portion cavity length ($L_{hc}$) to facilitate lift-off after subsequent deposition of gate metal layer.

According to this invention during imaging of the first mask pattern for forming the stem portion cavity (215, FIG. 2A) in the first photoresist layer (210), the exposing by the first light source (285-1) through the first mask (290-1) is performed with a pre-selected defocus value DF1 so that the top edges of first photoresist layer (210) defining the stem portion cavity (215) is rounded without any further thermal flow.

Figure 3A:
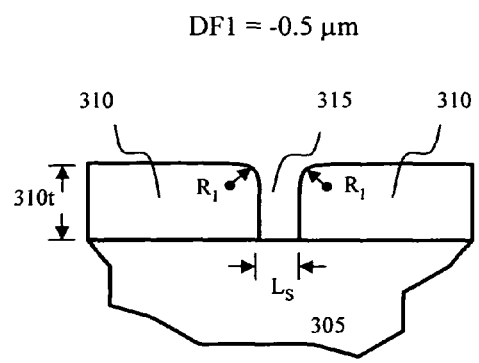
FIGS. 3A-3D show schematic cross-sectional views of a first photoresist layer after developing with different defocus values.
Figure 3B:
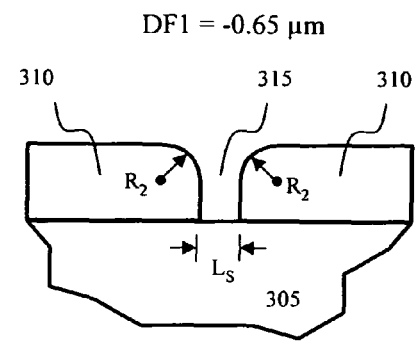
Figure 3C:
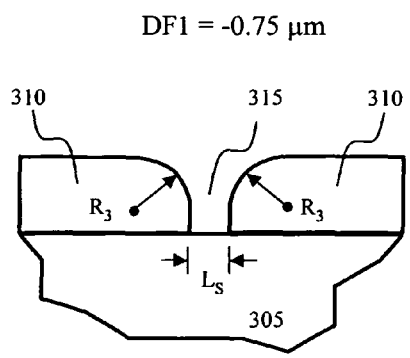

It is further noted that the degree of rounding of the top edges of the first photoresist layer (310) of a thickness (310t) is determined by the amount of first defocus value DF1 and may be represented by the radius of curvature: $R_1$, $R_2$ and $R_3$, as indicated in FIG. 3A~FIG. 3C. As the value of defocus is varied from −0.5 μm first to −0.65 μm and then to −0.75 μm, the radius of curvature of the rounded top edges increases from $R_1$ to $R_2$ and then to $R_3$. According to one other embodiment of this invention, the first defocus value DF1 for exposing the first photoresist layer (310) by a first light source (not shown) through a first mask (not shown) is in a range of −0.35~−1.2 μm and is more preferably in a range of −0.45~−0.9 μm.

Figure 3D:
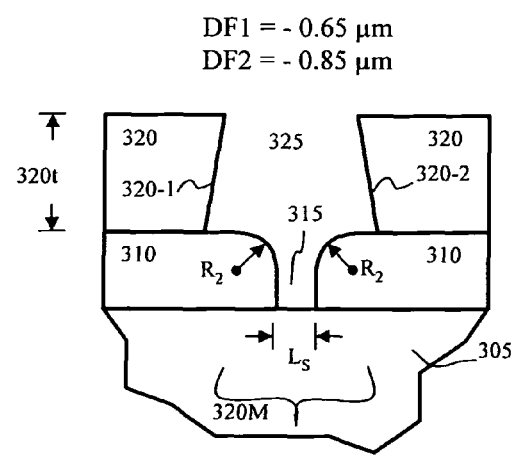

After the exposing, developing, rinsing and baking of the first photoresist layer (310), a second photoresist layer (320) of a second photoresist type shown in FIG. 3D is applied on top of the entire semiconductor substrate (350) to a second photoresist thickness (320t). A second soft bake is then performed before exposing the second photoresist (320) to a second light source (not shown) through a second mask (not shown) containing head portion cavity patterns. The first light source and the second light source is a light source selected from an i-line UV light source at 365 nm, a KrF DUV light source at 248 nm and an ArF DUV light source at 193 nm.

The central portion (320M, FIG. 3D) of the second photoresist layer (320) the second masking area will not be illuminated by the second light source due to the opaque second mask pattern. This unexposed second photoresist layer portion (320M) overlapping the first gate stem portion cavity (315) in the first photoresist layer (310) is removed during the second developing to form a head portion cavity (325). It is noted that the two side walls (320-1 and 320-2) of the head portion cavity (325) have negative slopes which are required for subsequent lift-off of metal layers after gate metal deposition. These negative slopes of the side walls (320-1 and 320-2) are achieved by:

(a) selecting the second photoresist type to be a negative type and specifically formulated for a lift-off process. The central portion of the second photoresist layer (320M) for the head portion cavity (325) is not exposed to the second light source whereas the surrounding regions of the second photoresist layer are exposed to the second light source and;

(b) selecting a proper second defocus value, DF2 for exposing the second photoresist layer by the second light source through the second mask. The second defocus value DF2 is selected in a range of −0.3 to −1.5 μm and is more preferably selected in a range of −0.45 to −1.2 μm. A schematic cross-sections of a first stem portion cavity (315) and a head portion cavity (325) are shown in FIG. 3D for DF1=−0.65 μm and DF2=−0.85 μm.

Example 1

An example with recommended parameters, tools and materials for the fabrication of a T-gate with a smooth transition from gate stem portion to gate head portion for HEMT is described. It should be pointed out that the purpose of this example is not to limited the scope of this invention.

To start the process, a layer of AR10L-600™, a commercial deep UV or DUV anti-reflectant available from Rohm and Haas Electronic Materials (now a part of Dow Corning), was spun-coated at 2,500 rpm onto a 6" GaAs wafer. The wafer is then baked at 150° C. for 60 sec to result in a film thickness of 60 nm as an anti-reflection layer for subsequent DUV imaging. A commercial DUV positive tone photoresist (UV 210-05™, available from Shipley™ Company) was spun-coated onto the GaAs wafer at 2,000 rpm and it was followed by a baking at 130° C. for 60 sec to give a film thickness of 450 nm. The sample is exposed through a first mask containing stem portion cavity patterns on an ASML PAS5500/750D DUV scanner with a KrF laser source at 248 nm (at NA=0.60 and sigma=0.6) with a first defocus value DF1=−0.65 μm to define stem portion cavity of a T-gate. The sample then is baked at 130° C. for 90 sec and developed in a 0.26 N tetramethyl ammonium hydroxide developer for 45 seconds in a single puddle at 23° C. to obtained the developed first photoresist layer with rounded top edges of a radius of curvature $R_2$=140 nm and a stem portion cavity length of 150 nm. A brief rinse of the wafer in DI water of 120 second is performed. This is followed by a hard bake at 140° C. for 60 seconds. Alternately, in order to harden the surface layer of the patterned first UV 210-05™ photoresist layer, a plasma hardening process is performed in a Lam Rainbow 4400 with a SF6 plasma under the following conditions: RF power 55 W for 40 seconds at a SF6 flow rate of 85 sccm and a pressure of 120 mtorr.

A layer of negative tone i-line photoresist for metal lift-off (AZ®nLOF®5510 photoresist from AZ® Electronic Materials Company) is applied onto the GaAs wafer as the second photoresist layer at 2,000 rpm. A soft bake at 90° C. for 60 seconds is carried out to obtain a second photoresist layer with a thickness of 1.1 µm. Exposure is then performed through a second mask containing head portion cavity patterns using an ASML PASS5500/200 with an i-line light source at 365 nm with a second defocus value DF2=−0.8 µm to define the head portion cavity. A post exposure bake at 110° C. for 90 seconds is performed. This is followed by developing the second photoresist layer in AZ® MIF300 Developer (2.38% w/w, available from AZ Electronic Materials Company) for 60 seconds at 23° C. in a single puddle. A head portion cavity of a length of 11,000 nm and side walls with negative slope (the angles with the surface of the second photoresist layer is 84°) is formed to connect the stem portion cavity and to form a T-gate cavity.

A hard bake at 120° C. for 60 seconds is then performed and this is followed by a descumming process in a model Matrix 105 system under the following conditions: at 60° C. in $O_2$ downstream plasma at $O_2$ flow rate of 260 sccm at pressure of 4.0 torr and RF power of 150 W for 40 seconds. This process removed a top photoresist layer with a thickness of about 60 nm. After the descum, the wafer was introduced into a multisource Temescal™ e-beam vacuum evaporation system to evaporate gate metal layers to the following thickness: Ti/Pt/Au: 60 nm/30 nm/600 nm. After the vacuum evaporation of the gate metal layers, the wafer is immersed in a solvent NMP tank at 70° C. for 20 minutes with intermittent mega sonic agitation followed by an NMP spray at 100 kg/cm² in an SSEC model 3303 lift-off system to achieve the lift-off of the unwanted metal regions on the second photoresist and removal of both the first photoresist layer and the second photoresist layer. After the lift-off, the wafer is rinsed with DI water for 120 seconds and an optional ashing process may be performed in an ashing system. This step may be skipped if the above lift-off process has been performed thoroughly. After cleaning or an optional ashing process, a pHEMT with a T-gate with a total gate height of 690 nm and a gate length of $L_g$=250 nm is obtain.

The wafer is then introduced into a Plasma Therm™ Versalock® PECVD system for deposition of a $Si_3N_4$ passivation layer. The deposition is carried out at a substrate temperature of 200° C. with a $(He+N_2)/NH_3$ ratio of 0.7. Here, a $N_2$+He mixture with 25% $N_2$ is used. An RF power of 250 W is used to achieve a film of 120 nm with minimal stresses. After the passivation layer deposition, the pHEMTs devices is ready for tests.

T-Gate with a Feature Shrinking Layer:

As stated before, the lithography resolution limit R is given by $R=k_1[\lambda/NA]$ where both and NA are determined by the lithography tools and only value of $k_1$ is process conditions related. Although the values of $k_1$ can be 0.3 or less, in practical manufactures, $k_1$ may be chosen to be larger than 0.3 with the purpose of relaxing the processing conditions and increasing the yield. It would be ideal if $k_1$ of 0.4 or larger can still be used in order to relax the processing conditions and to increase yield. For lithography tools employing either an i-line UV source at 365 nm, a deep UV KrF laser source at 248 nm or an ArF DUV laser source at 193 nm, the resolution R using base line projection lens can be estimated as follows: R=350 nm for the i-line UV source at 365 nm, R=180 nm for the DUV KrF laser source at 248 nm, and R=130 nm for ArF DUV laser source at 193 nm. The above resolution values are estimated for strict process controls with $k_1$=0.3. Even so, the above R values may still not be sufficient for manufacturing of features of dimensions approaching 100 nm or less which are required for high speed MMICs, unless with the adoption of some resolution enhancement techniques.

According to one other embodiment of this invention, a process for fabricating a HEMT (400d' in FIG. 4H and 400d in FIG. 4I) with a T-gate (450) on a semiconductor substrate (405) having a source (420S) and a drain (420D) is provided. Although there is at least a barrier layer and a channel layer in the semiconductor substrate, the barrier layer and channel layer are not shown in FIG. 4 for simplicity of the description. The fabrication process comprises the steps of:

(1) applying a first photoresist layer (410, FIG. 4A) of a first photoresist type (preferably a positive type) to a first photoresist layer thickness (410t) on the semiconductor substrate (405) and performing a first soft baking of the first photoresist layer;

(2) performing a first exposure using a first light source through a first mask containing stem portion cavity patterns on the first photoresist layer (410) with a selected first defocus value DF1, where the first light source is selected from an i-line UV light source at 365 nm, a KrF DUV light source at 248 nm or an ArF DUV light source at 193 nm; wherein amount of the first defocus value (defined as a deviation from accurate focus or a difference in distance between the focused image of the first mask pattern and the center position of the first photoresist layer) DF1 is preferably selected as negative and in a range of −0.35 µm to −1.2 µm and is more preferably selected in a range of −0.45 µm to −0.9 µM in order to obtain rounded top edges for the first photoresist layer after a subsequent first developing;

(3) carrying out a first developing process to form a first stem portion cavity (415-1) with rounded top edge radius of curvature, $R_2$ and a first stem portion cavity length ($L_{as}$), which is greater than the gate length or the gate stem portion length ($L_a$, see FIG. 4D) required for the final T-gate of the HEMT;

(4) apply a first feature shrinking layer (460) with a feature shrinking layer thickness (460t see FIG. 4B) on the first photoresist layer (410) where materials for the feature shrinking layer may be a RELACS polymer;

RELACS polymer is an organic material that is used in semiconductor circuit fabrication to modify photoresist features. A heat treatment will allow some of the acid in the first photoresist layer to diffuse into the RELACS layer and causing cross-link in a portion of the RELACS so that the cross-linked RELACS becomes insoluble in subsequent rinsing or development and will remain on the surfaces of the first photoresist layer to provide modification of the features and sizes originally created by the first photoresist layer alone. Principles and information can be found in "0.1 µm Level Contact Hole Pattern Fabrication with KrF Lithography by Resolution Enhancement Lithography Assisted by Chemical Shrink (RELACS)" by T. Toyoshima et al, International Electron Device Meeting, 1998, IEDM 98-333-98-336. Although RELACS has been used in the present examples. It should be noted that feature shrinking layer materials other than the RELACS series may well be used for the feature shrinking purposes, some examples are AZ® SH-114 and AZ® SH-114A.

(5) carrying out a first shrinking diffusion bake to allow for a controlled amount of acid or PAC in the first photoresist layer (410) to diffuse into the first feature shrinking layer (460) so that a diffused feature shrinking layer (465, FIG.

4C) is formed at interfaces between the first photoresist layer (410) and the first feature shrinking layer (460) with a diffused feature shrinking layer thickness (465$t$), said diffused feature shrinking layer (465) is insoluble in a water based clean solution or a developer;

(6) rinsing or developing the semiconductor substrate with the heat treated diffused feature shrinking layer in a water based clean solution or development solution to wash away the unaffected portion of the feature shrinking layer;

After the rinsing or developing, the diffused feature shrinking layer (465, FIG. 4D) remains on the surfaces of the first photoresist layer (410) and combines with the first photoresist layer to form a second stem portion cavity (415) or diffused stem portion cavity, having a second stem portion cavity length ($L_S$) which is substantially smaller than first stem portion cavity length ($L_{SS}$, FIG. 4A) defined by the first photoresist layer (410) alone and the value of the second stem portion cavity length ($L_S$) is controlled to be substantially equal to the final gate length ($L_g$) or the stem portion length of the T-gate. The diffused feature shrinking layer thickness (465$t$) is affected by the degree of acid or PAC diffusion into the first feature shrinking layer (460) and hence is affected by the temperature and the time used for the first shrinking diffusion bake. Therefore, the second stem portion cavity length ($L_S$) may be controlled conveniently to the required gate length or gate stem portion length of the HEMTs. It is noted that: $L_S=L_{SS}-465t-465t$.

(7) performing a plasma hardening process to harden the surface of the diffused feature shrinking layer (465) in a reactive etching system such as Lam Rainbow 4400 system with a SF6 plasma at a given SF6 flow rate 85 sccm and a pressure at about 120 mtorr, using RF power 55 W for about 40 seconds;

This hardening step for the diffused feature shrinking layer (465) is essential. Without such a hardening, the diffused feature shrinking layer is too soft so that it may be partially or completely dissolved in a second photoresist layer to be applied for the forming of a head portion cavity, due to solvent in the second photoresist layer. In such a case, the resulted stem portion cavity length after developing of the second photoresist layer may be larger than the desired second stem portion cavity length $L_S$.

Figure 4A:
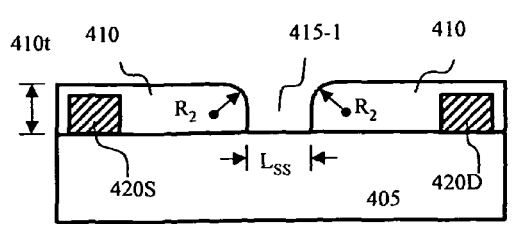
FIGS. 4A-4K show schematic cross-sectional views of a semiconductor substrate (405) at different stages of forming a T-gate.
Figure 4B:
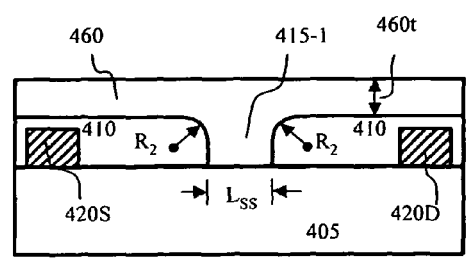
Figure 4C:
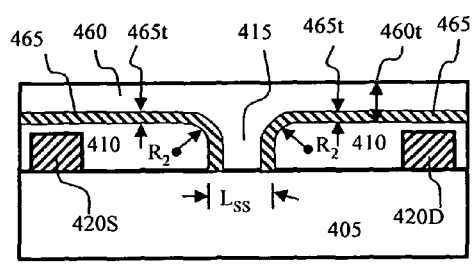
Figure 4D:
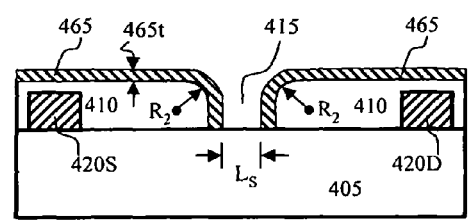
Figure 4E:
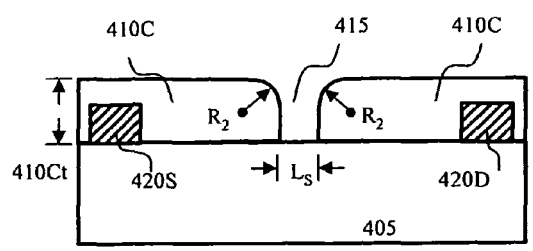

After the hardening step, a simplified cross sectional view is shown in FIG. 4E, where the diffused feature shrinking layer (465) is not separately marked and is combined with the first photoresist layer (410) forming a combined first photoresist layer (410C) with a combined first photoresist layer thickness (410Ct).

(8) applying a second photoresist layer (420) having a second photoresist type and a second photoresist layer thickness (420$t$, FIG. 4F) and carrying out soft baking;

According to this invention, during the imaging of the second photoresist layer (420), in order to prevent interference in the overlapping portion of the first photoresist layer (410) and the second photoresist layer (420) in the second masking area which defines the head portion cavity (425), the second photoresist type is preferably chosen to be negative, which is opposite to the first photoresist type. Therefore, the region in the second photoresist layer to form the head portion cavity (425) will be blocked by the opaque second mask pattern and will not be exposed to the second light source so that it can be removed during the developing. The second light source also will not reach the first photoresist portions overlapping the second masking area and the integrity of the stem portion cavity (415) will be retained during the developing of the second photoresist layer.

(9) perform a second exposure to a second light source through a second mask containing head portion cavity patterns with a second defocus value DF2 (preferably selected in a range of −0.35 to −1.5 μm and more preferably selected in a range of −0.45 to 1.2 μm) and a second development process to form a head portion cavity (425, FIG. 4F) having head portion cavity side walls (420-1 and 420-2) with negative slopes for facilitating subsequent lift-off process, where the second light source is selected from an i-line UV light source at 365 nm, a KrF DUV light source at 248 nm or an ArF DUV light source at 193 nm;

(10) perform a second post exposure baking of the second photoresist layer;

(11) depositing gate metal layers (450, 450-1, 450-2, FIG. 4G) to a gate layer thickness (450$t$);

The gate metal layers (450) consist of multilayer metals such as Ti—Pt—Au, Pt—Ti—Pt—Au, Ni—Al—Au or Ni—Au with a plurality of sub-layers as long as a first gate sub-layer deposited having a good adhesion and rectifying contact to a semiconductor barrier layer in the top surface region of the semiconductor substrate and subsequent gate meal sub-layers having low electrical resistivity and good thermal stability.

(12) carrying out a lift-off process to remove the unwanted gate layer (450-1, 450-2) deposited on the second photoresist layer (420) and removing the combined first photoresist layer (410C) and the second photoresist layer (420) to form a HEMT (400$h$ FIG. 4H) with a T-gate (450). The T-gate (450) has a gate stem portion with a gate stem portion length or a gate length $L_S$ and a gate head portion with a gate head portion length $L_h$ (not shown) and a T-gate height $H_G$.

An additional solution processing to remove the diffused feature shrinking layer (465) can be optionally performed if it has not been completely removed by the above-mentioned developing process. After a through cleaning process, the HEMT device (400$h$) is ready for testing.

In order to improve thermal stability of the HEMT device (400$h$), a passivation layer (430, 430-1, 430-2, FIG. 4I) with a passivation layer thickness (430$t$) to yield a passivated HEMT (400$i$). Material of the passivation layer is selected from a material group including: silicon oxide, silicon nitride, hafnium oxide, aluminum oxide and their mixtures.

It should be noted that when attempting to heat the first photoresist layer to achieve thermal flow without forming a diffused feature shrinking layer on the first photoresist layer, the nature of deformation of the first photoresist layer will be different from that when a diffused feature shrinking layer has been formed. Without the diffused shrinking layer, the stem portion cavity length in the first photoresist layer will sometimes increase instead of decrease after the thermal flow of the first photoresist layer. Therefore, gate length of a T-gate cannot be made smaller as required by the high frequency operation of the HEMTs.

Figure 4F:
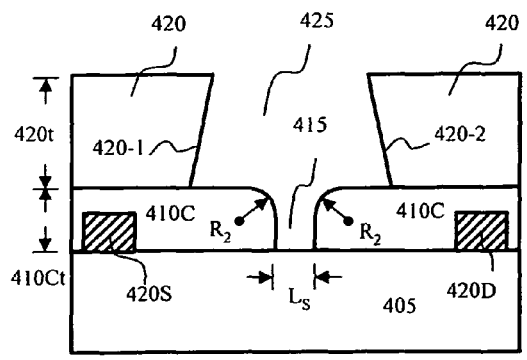
Figure 4G:
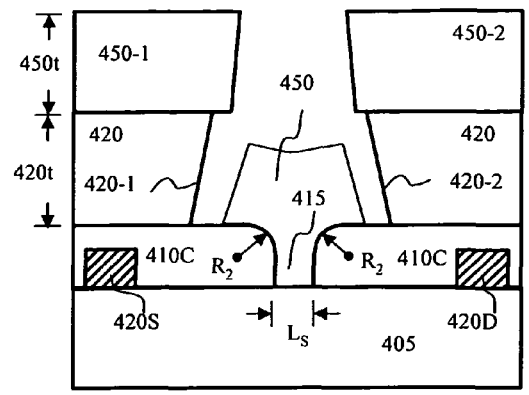
Figure 4H:
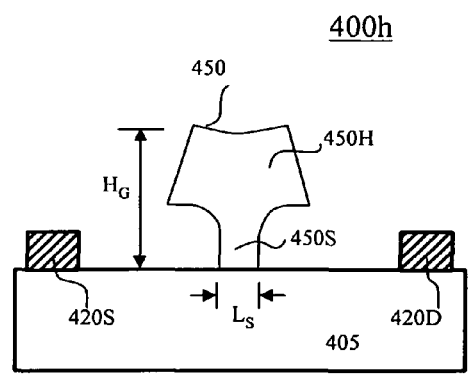
Figure 4I:
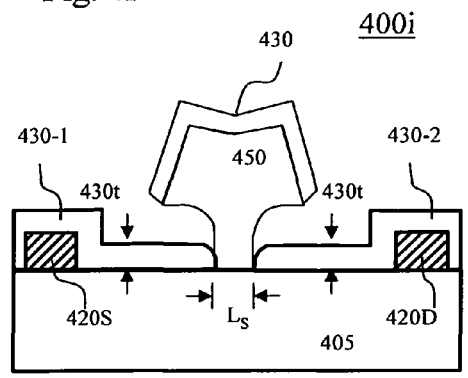
Figure 4J:
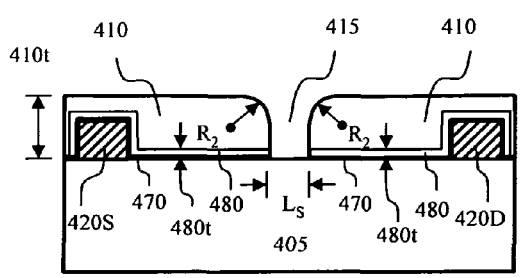

According to another embodiment of this invention, the combined first photoresist layer (410C) and the second photoresist layer (420) in FIG. 4F are hardened after development and rinsing. The hardening of the photoresist layers is achieved by a method selected from: thermal baking, IR irradiation and plasma treatment.

In order to enhance adhesion between the first photoresist layer (410) and the semiconductor substrate (405), a thin layer of primer (470, FIG. 4J) is applied onto the semiconductor substrate prior to the deposition of the first photoresist layer (410). Such primer layer maybe be applied by spin coating or by vapour deposition.

In order to minimize unwanted reflection of the first light source during exposure of the first photoresist layer, a first anti-reflection layer (480, FIG. 4J) is applied on the semiconductor substrate prior to the application of the first photoresist layer (410), first anti-reflection layer thickness (480t) is selected so that the amount of reflection of the first light from the first light source is minimum to enhance the resolution of exposing or imaging of the stem portion cavity (415).

Figure 4K:
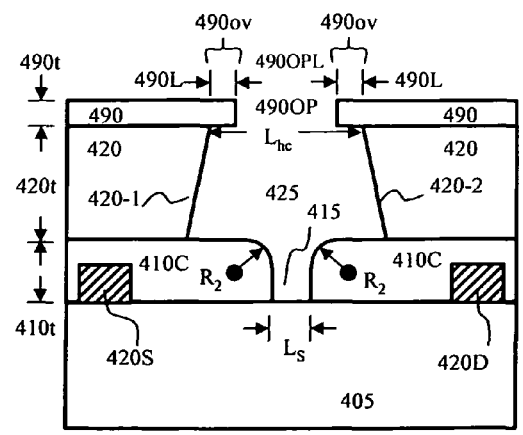

According to another embodiment of this invention, the definition of a head portion cavity (425) for the T-gate may well be achieved by having a third photoresist layer (490) as shown in FIG. 4K. After the application and soft baking of the second photoresist layer (420), a third photoresist layer (490) with a third photoresist type and a third photoresist layer thickness (490t) is applied and soft baked. The third photoresist type is the same as the second photoresist type so that the third and the second photoresist layers can be exposed in the same second exposure process. After the third photoresist soft baking, a second exposure using a second light source through a second mask is performed to expose both the second photoresist layer (420) and the third photoresist layer (490). According to an embodiment of the invention, the developing sensitivity of the third photoresist layer (490) is selected to be smaller than the developing sensitivity of the second photoresist layer (420). After a second developing, a head portion cavity (425) with a head portion cavity length ($L_{hc}$) will be created in the second photoresist layer (420). Due to the lower developing sensitivity of the third photoresist layer (490), a third photoresist opening (490OP) with a third photoresist layer opening length (49OPL) and a third photoresist overhang (490ov) of a third photoresist overhang length (490L) is created. This third photoresist layer opening length (490OPL) is slightly smaller than the head portion cavity length ($L_{hc}$) to facilitate lift-off after subsequent deposition of gate metal layers.

T-Gate with Feature Shrinking Layer and a Thermal Flowing Process:

As described before, the lithography resolution R is given by R=$k_1$[λ/NA], where both λ and NA are determined by the lithography tools and value of $k_1$ is process conditions related. Although the values of $k_1$ can be 0.3 or less, $k_1$ values in practical manufacturing could be more than 0.3 in order to relax the processing conditions and increase the yield. It would be beneficial if processes can be developed with a $k_1$ value of 0.4 or larger. For lithography tools employing either an i-line UV source at 365 nm, a deep UV KrF laser sources at 248 nm or an DUV ArF laser source at 193 nm, the resolution R using base line projection lens can be estimated as follows: R=350 nm for the i-line UV source, R=180 nm for DUV KrF laser source at 248 nm, and R=130 nm for DUV ArF laser source at 193 nm. Even with the adoption of a cavity feature shrinking layer such as RELACS described before, above resolution values R may still not be sufficient for manufacturing T-gate with a gate length less than 100 nm and less (70 nm), especially for the i-line source and the KrF laser source.

According to the yet another embodiment of this invention, a process for manufacturing HEMT (550h in FIG. 5H] and 550i in FIG. 5I) with a T-gate (550) for MMICs on a semiconductor substrate (505) having a source (520S, see FIGS. 5G-5K) and a drain (520D, see FIGS. 5G-5K) is provided. Although there is at least a barrier layer and a channel layer in the semiconductor substrate (505), the barrier layer and channel layer are not shown in FIGS. 5A-5K for simplicity of the description. The fabrication process comprises the steps of:

(1) applying a first photoresist layer (510, FIG. 5A) of a first photoresist type (preferably a positive type) to a first photoresist layer thickness (510t) on a semiconductor substrate (505) and performing a first soft baking of the first photoresist layer;

(2) carrying out a first exposure using a first light source through a first mask containing stem portion cavity patterns on the first photoresist layer with a selected first defocus value DF1 (preferably selected in a range of −0.35 µm to −1.2 µm and is more preferably selected in a range of −0.45 µm to −0.9 µm), where the first light source is selected from an i-line UV light source at 365 nm, a DUV KrF laser source at 248 nm or an DUV ArF laser at 193 nm;

(3) performing a first developing process to form a first stem portion cavity (515-1) with rounded top edge radius of curvature $R_2$ (FIG. 5B) and a first stem portion cavity length ($L_{S1}$), which is greater than the gate length or the gate stem portion length ($L_s$, see FIG. 5G) required for the final T-gate of the HEMT;

(4) applying a feature shrinking layer (560) with a feature shrinking layer thickness (560t see FIG. 5B) on the first photoresist layer, material for the feature shrinking layer may be a polymer in the RELACS series;

As mentioned before, RELACS polymer is an organic material used in Si semiconductor circuit fabrication to modify photoresist features. A heat treatment allows some of the acid in the first photoresist layer to diffuse into the RELACS layer and causing cross-link in a portion of the RELACS so that the cross-linked RELACS becomes insoluble in subsequent rinsing or development and will remain on the surface of the first photoresist layer to provide modification of the features and sizes originally created by the first photoresist layer alone. It should be noted that feature shrinking layer materials other than the RELACS series may well be used for the feature shrinking purposes, some examples are AZ® SH-114 and AZ® SH-114A.

Figure 5A:
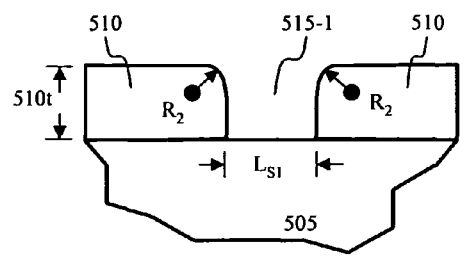
FIGS. 5A-5K show schematic cross-sectional views of a semiconductor substrate (505) at different stages of forming a T-gate.
Figure 5B:
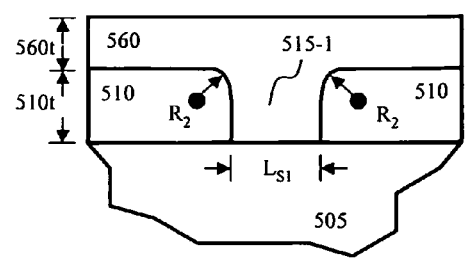
Figure 5C:
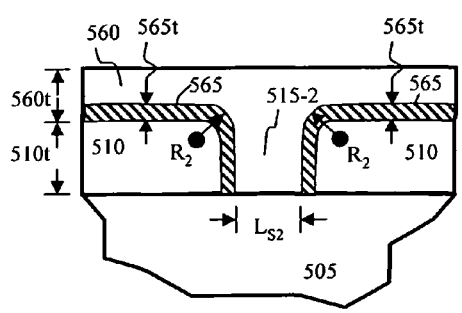
Figure 5D:
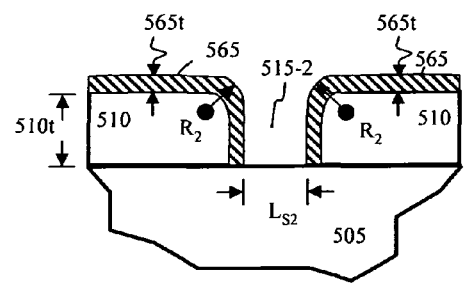

(5) carrying a first shrinking diffusion bake to allow for a controlled amount of acid or PAC in the first photoresist layer (510) to diffuse into the first feature shrinking layer (560) so that a insoluble diffused feature shrinking layer (565, FIG. 5C) is formed at interfaces between the first photoresist layer (510) and the feature shrinking layer (560) with a diffused feature shrinking layer thickness (565t);

(6) rinsing or developing the semiconductor substrate in a water based clean solution or development solution to wash away unaffected portion of the feature shrinking layer (FIG. 5D) to form a second stem portion cavity (515-2) having a second stem portion cavity length ($L_{S2}$, FIG. 5D);

After the above rinsing or developing, the diffused feature shrinking layer (565) remains on the surfaces of first photoresist layer (510) and combines with the first photoresist layer to form a second stem portion cavity (515-2) with a second stem portion cavity length ($L_{S2}$) substantially smaller than the first stem portion cavity length $L_{S1}$ defined by the first photoresist layer alone: $L_{S2}=[L_{S1}-565t-565t]$. It is noted that the diffused feature shrinking layer thickness (565t) is affected by the degree of acid or PAC diffusion into the first feature shrinking layer and hence is affected by the temperature and the time used for the first shrinking diffusion bake. Therefore, the second stem portion cavity length ($L_{S2}$) may be controlled conveniently to the required value by selecting the temperature and time for the first shrinking diffusion bake. However, due to the relatively large first stem portion cavity length ($L_{S1}$) resulted from a lithography of low resolution, the second stem portion cavity length ($L_{S2}$) may still be larger than the required gate length ($L_g$) or the gate stem portion length ($L_S$). According to this invention, in order to reduce further the value of the second stem portion cavity length ($L_{S2}$) to a value equal to ($L_g$), a subsequent thermal flow process of the wafer is needed.

Figure 5E:
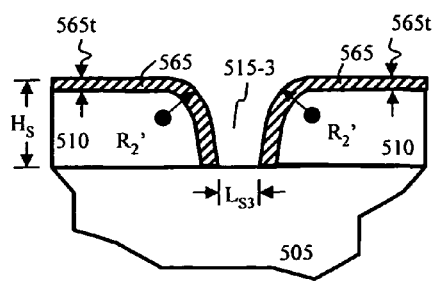
Figure 5F:
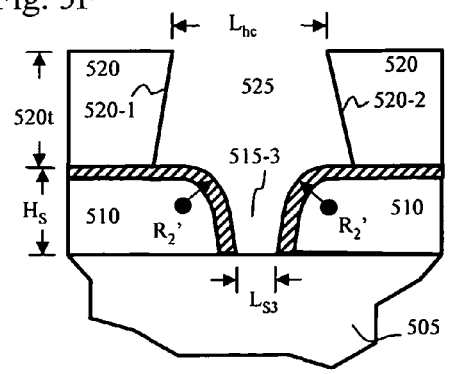
Figure 5G:
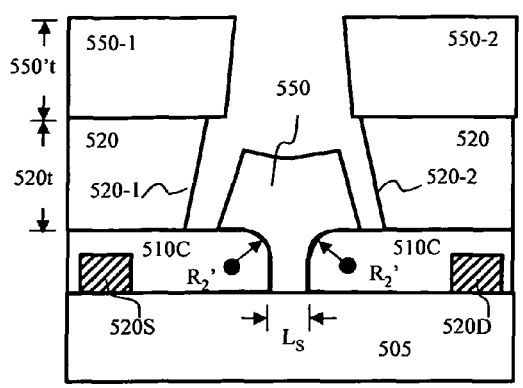
Figure 5H:
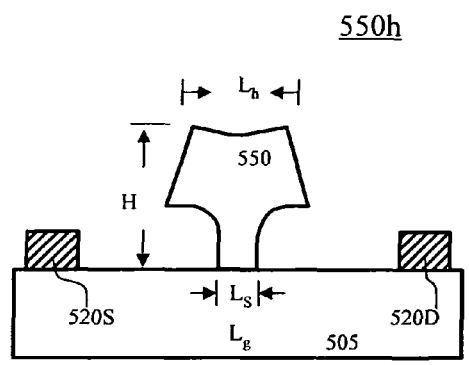
Figure 5I:
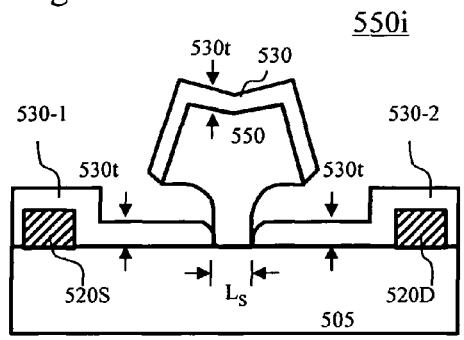
Figure 5J:
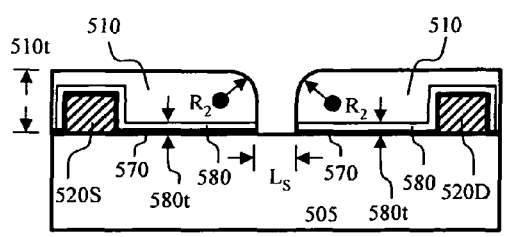

(7) perform a thermal flow at a thermal flow temperature for a period of thermal flow time so that the top edges of the first photoresist layer (510) and the diffused feature shrinking layer (565) are rounded with a new radius of curvature of $R_2'$ (FIG. 5E);

At this stage, a portion of the first photoresist layer and diffused feature shrinking layer is deformed to result in a third stem portion cavity (515-3) having a third stem portion cavity length ($L_{S3}$, FIG. 5E), where $L_{S2} > L_{S3} = L_S = L_g$, which is the required gate length value for the final T-gate of the HEMT (550h) shown in FIG. 5H.

(8) performing a plasma hardening process to harden the surface layer of the diffused feature shrinking layer (565) in a Lam Rainbow 4400 with a SF6 plasma at a SF6 flow rate of 85 sccm and a pressure of 120 mtorr, using RF power 55 W for 40 seconds;

This hardening process for the diffused feature shrinking layer is essential. Without it, the diffused feature shrinking layer is too soft and it may be partially or completely dissolved in a second photoresist layer to be applied for the forming of a head portion cavity. In such a case, after developing of the second photoresist layer, the resulted stem portion cavity length may be larger than the desired third stem portion cavity length ($L_{S3}$).

(9) applying a second photoresist layer (520, FIG. 5F) with a second photoresist type to a second photoresist layer thickness (520t) and carrying out a soft baked;

According to this invention, during the imaging of the second photoresist layer (520), in order to prevent interference in the overlapping portion of the first photoresist layer (510) and the second photoresist layer (520) in the second masking area which defines the head portion cavity (525), the second photoresist type is preferably chosen to be negative, which is opposite to the first photoresist type. Therefore, the region in the second photoresist layer to form the head portion cavity (525) will be blocked by the opaque second mask pattern and will not be exposed to the second light source so that it can be removed during the developing. The second light source also will not reach the first photoresist portions overlapping the second masking area and the integrity of the stem portion cavity (515) will be retained during the developing of the second photoresist layer.

(10) performing a second exposure to a second light source through a second mask containing head portion cavity patterns with a second defocus value DF2 (preferably selected in a range of −0.35 to −1.5 μm and more preferably selected in a range of −0.45 to 1.2 μm) and a second development process to form a head portion cavity (525, FIG. 5F) having a head portion cavity length ($L_{hc}$) and head portion cavity side walls (520-1, 520-2) with a negative side slopes for facilitating subsequent lift-off process, where the second light source is selected from an i-line UV light source at 365 nm, an KrF DUV laser at 248 nm and a ArF DUV laser at 193 nm;

(11) depositing gate metal layers (550, 550-1, 550-2, FIG. 5G) to a gate metal layer thickness (550t);

The gate metal layers consist of multilayer metals having a plurality of sub-layers. A first gate sub-layer deposited should have a good adhesion and rectifying electrical properties to the semiconductor barrier layer in the top surface region of the semiconductor substrate. Subsequent gate metal sub-layers should have low electrical resistivity and good thermal stability. The gate metal multilayer could be Ti—Pt—Au, Pt—Ti—Pt—Au, Ni—Au or Ni—Cu—Au. In FIGS. 5G-5K, both drain and source (520D, 520S) are also shown. Also in FIG. 5G, the first photoresist layer (510) and the diffused feature shrinking layer (565) is represented by a combined first photoresist layer (510C).

(12) carrying out a lift-off process to remove the unwanted gate metal layers (550-1, 550-2) deposited on the second photoresist layer (520) and removing the combined first photoresist layer (510C) and the second photoresist layer (520) to form a HEMT (550h) with T-gate (550, FIG. 5H). The T-gate has a gate stem portion with a final gate stem portion length or a gate length $L_S$ and a gate head portion with a gate head portion length ($L_h$) and a T-gate height (H).

An optional or additional solution processing to remove the diffused feature shrinking layer (565) may be performed if it has not been completely removed. After a careful rinsing, drying or baking, the HEMT device (500h, FIG. 5H) is ready for testing.

In order to improve thermal stability of the HEMT device (550h), a passivation layer (530, 530-1, 530-2, FIG. 5I) with a passivation layer thickness (530t) to yield a final HEMT device (550i). Material of the passivation layer is selected from a material group of: silicon oxide, silicon nitride hafnium oxide, aluminum oxide and their mixtures.

According to another embodiment of this invention, the first photoresist layer (510) and the second photoresist layer (520) are hardened after its development and rinsing. The hardening of the first photoresist layer and second photoresist layer is achieved by a method selected from: thermal baking, IR irradiation and plasma treatment.

In order to enhance adhesion of the first photoresist layer (510) to the semiconductor substrate (505), a thin layer of primer (570, FIG. 5J) is applied onto the semiconductor substrate prior to the deposition of the first photoresist layer (510). Such primer layer maybe be applied by spin coating or by vapour deposition.

In order to minimize any unwanted reflection of the first light source during the exposure of the first photoresist layer (510), a first anti-reflection layer (580, FIG. 5J) is applied on the semiconductor substrate prior to the application of the first photoresist layer, the thickness of the first anti-reflection layer (580t) is selected to ensure a minimized amount of reflected first light and to enhance the resolution of the stem portion cavity.

Figure 5K:
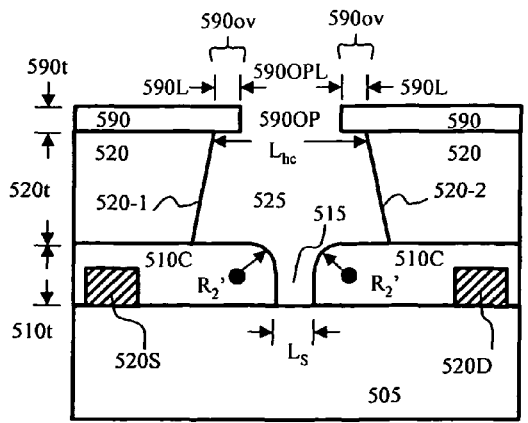

According to yet another embodiment of this invention and as shown in FIG. 5K, the definition of a head portion cavity (525) for a T-gate may be achieved by having a third photoresist layer (590). After the application and soft baking of the second photoresist layer (520), a third photoresist layer (590) with a third photoresist type and a third photoresist layer thickness (590t) is applied and soft baked. The third photoresist type is the same as the second photoresist type so that the third and the second photoresist layers can be exposed in the same second exposure process. After the third photoresist soft baking, a second exposure using a second light source through a second mask is performed to expose both the second photoresist layer (520) and the third photoresist layer (590). According to an embodiment of this invention, the developing sensitivity of the third photoresist layer (590) is selected to be smaller than the developing sensitivity of the second photoresist layer (520), so that after a second developing, a head portion cavity (525) with a head portion cavity length ($L_{hc}$) will be created in the second photoresist layer (520). Due to lower developing sensitivity of the third photoresist layer, a third photoresist overhang (590ov) with a third photoresist overhang length (590L) is created. As a result of the overhang, a third photoresist opening (590OP) is formed to have a third photoresist layer opening length (590OPL) slightly smaller than the head portion cavity length ($L_{hc}$) to facilitate lift-off after subsequent deposition of gate metal layer.

Example 2

An example with recommended parameters, tools and materials for the fabrication of T-gate with a smooth transition from the gate stem portion to the gate head portion including a resolution enhancement technique (RET) to achieve the required gate length for HEMT is described. It should be pointed out that the purpose of this example is not to limited the scope of this invention.

To start the process, a layer of AR10L-600™, a commercial deep UV or DUV anti-reflectant available from Rohm and Haas Electronic Materials (now a part of Dow Corning), is spun-coated at 2,500 rpm onto a 6" Si wafer with AlN—GaN—AlGaN buffer layer/channel layer/barrier layer on top. The wafer is then baked at 150° C. for 60 sec to give a film thickness of 60 nm as an anti-reflection layer for subsequent DUV imaging. A commercial DUV positive tone photoresist (UV 210-05™, available from Shipley™ Company) is spun-coated on the Si wafer at 1,700 rpm and is baked at 130° C. for 60 sec to give a film thickness of 550 nm. The sample is then exposed through a first mask containing first stem portion cavity patterns on an ASML PAS5500/750D DUV scanner with a KrF laser source at 248 nm (NA=0.60 and sigma=0.6) with a first defocus value DF1=−0.65 μm to define a first stem portion cavity of a T-gate. The sample is baked at 130° C. for 90 sec and developed in a 0.26 N tetramethyl ammonium hydroxide developer for 45 seconds in a single puddle at 23° C. to obtain a after-developing first photoresist layer with substantially rounded top edges and a stem portion cavity length of 233 nm. A brief rinse of the wafer in DI water for 120 second is performed and this is followed by a hard bake at 120° C. for 60 seconds.

The Si wafer is then coated with a feature shrinking layer AZ® R200 (a polyvinylalcohol/crosslinker coating available from AZ Electronic Materials) at 2500 rpm and is baked at 85° C. for 60 sec. A mixing bake (or diffusion bake) is then performed at 115° C. for 70 sec to crosslink the shrink material. The film thickness of the AZ® R200 feature shrinking layer is monitored on a separate bare silicon wafer and is determined to be 750 nm. Solution for removal of unaffected shrinking layer is made of water solutions mixed with a 1 wt % of surfactants. The wafer is subsequently developed by puddling of the removal solution on the wafer for 60 sec, followed by a DI water rinse. In the end, a layer of diffused feature shrinking with a thickness of 40 nm is formed over the UV210-05 first photoresist layer and a second stem portion cavity having a reduced second stem portion cavity length of 150 nm is created.

Alternately, a AZ® SH114 feature shrinking material may be used under the following conditions: coating at 2500 rpm; baked at 85° C. for 60 sec; mixing bake (or diffusion bake) at 115° C. for 70 sec to crosslink the shrink material. The film thickness of the AZ® SH114 layer was determined to be 750 nm on a separate bare silicon monitor wafer. Removal solution made of water mixed with a 1 wt % of surfactants is used. The wafer is developed by puddling of the removal solution on the wafer for 60 sec and followed by DI water rinse. At last, a layer of diffused feature shrinking with a thickness of 40 nm is formed on the UV210-05 first photoresist layer and a second stem portion cavity having a second stem portion cavity length of 150 nm is created.

A thermal flow process is carried out at 123° C. for 25 minutes in air to cause the first photoresist layer and the diffused feature shrinking layer to deform to produce a third stem portion cavity with a third stem portion cavity length of 110 nm.

In order to harden the surface layer of the diffused feature shrinking layer, a plasma hardening (or a plasma treatment) process is performed in a Lam Rainbow 4400 with a SF6 plasma under the following conditions: RF power 55 W for 40 seconds at a SF6 flow rate of 85 sccm and a pressure of 120 mtorr. This hardening of the diffused feature shrinking layer is essential. Without it, the diffused feature shrinking layer is too soft so that it may be partially or completely dissolved when a second photoresist layer is applied, due to solvents present in the second photoresist layer. When this happen, the resulted stem portion cavity length after the development of the second photoresist layer may be larger than the desired third stem portion cavity length of 110 nm.

A layer of negative tone i-line photoresist (AZ®nLOF®5510 photoresist from AZ® Electronic Materials Company) is then applied at 2,000 rpm onto the Si wafer with the stem portion cavities to form the second photoresist layer. A soft bake at 90° C. for 60 seconds is carried out to obtain a second photoresist layer thickness of 1.15 μm. A second exposure is then performed through a second mask containing head portion cavity patterns using an ASML PASS5500/200 with an i-line light source at 365 nm with a second defocus value DF2=−0.7 μm to define the head portion cavity. A post exposure bake at 110° C. for 90 seconds is performed. This is followed by developing the second photoresist layer in a AZ® MIF300 Developer (2.38% w/w, available from AZ Electronic Materials Company) for 60 seconds at 23° C. in a single puddle. A head portion cavity having a length of 550 nm and side walls of negative slopes (angles with the surface of the second photoresist layer is 83°) is formed to connect the stem portion cavity and to form a complete T-gate cavity. A hard bake at 120° C. for 60 seconds is then performed. A photoresist descum is carried out in a model Matrix 105 system under the following conditions: RF power 150 W; 40 seconds; 60° C.; in $O_2$ downstream plasma at $O_2$ flow rate 250 sccm and pressure 4.1 torr. This process removes a top photoresist layer with a thickness of 60 nm. After the descum, the wafer is introduced into a multi-source Temescal™ e-beam vacuum evaporation system to evaporate gate metal layers to the following thickness: Ni/Au=10 nm/400 nm. After the vacuum evaporation of the gate metal layers, the wafer is immersed in a solvent NMP tank at 70° C. for 20 minutes with intermittent mega sonic agitation. Then an NMP spray is done at 100 kg/cm$^2$ in an SSEC model 3303 lift-off system to achieve the lift-off of any unwanted metal regions on the second photoresist and the removal of both the first photoresist layer and the second photoresist layer. The wafer is rinsed in DI water for 150 seconds before going through an ashing process in an ashing system. This ashing process is optional and may be skipped if the above lift-off process is performed thoroughly. After cleaning or the optional ashing, a GaN HEMT with a T-gate of a gate height of 410 nm and a gate length of $L_g$=110 nm were obtained.

Finally, the wafer is introduced into a Plasma Therm™ Versalock® PECVD system for the deposition of a $Si_3N_4$ passivation layer. The deposition is performed at a substrate temperature of 200° C. with a $(He+N_2)/NH_3$ ratio of 0.7. A $N_2$+He mixture with 25% $N_2$ is used. An RF power of 250 W is used to reach a thickness of 80 nm with minimal stresses. After the passivation layer deposition, the GaN HEMT device is ready for tests.

What is claimed is:

1. A process for forming a gate of a thin film transistor device with enhanced mechanical strength comprises the steps of:
   forming a first photoresist layer having a first photoresist layer thickness and a first photoresist type on a semiconductor substrate and performing a first soft baking of said first photoresist layer;
   exposing said first photoresist layer to a first light source through a first mask having first mask patterns with a selected first defocus value;
   performing a first post exposure baking of said first photoresist layer, developing and rinsing to form a first stem portion cavity having rounded top edges and a first stem portion cavity length in said first photoresist layer;
   performing a first hard baking of said developed first photoresist layer;
   forming a second photoresist layer having a second photoresist layer thickness, a second photoresist type and a second photoresist developing sensitivity on said first photoresist layer and performing a second soft baking of said second photoresist layer;
   exposing said second photoresist layer to a second light source through a second mask having second mask patterns with a selected second defocus value;
   performing a second post exposure baking of said second photoresist layer, developing and rinsing to form a head portion cavity in said second photoresist layer;
   performing a second hard baking of said developed second photoresist layer;
   depositing gate metal layers by a vacuum deposition method;
   performing lift-off of said gate metal layers on said second photoresist layer;
   removing said first photoresist layer and second photoresist layer; and
   rinsing and baking to complete fabrication of said gate.

2. A process for forming a gate of a thin film transistor device according to claim 1, wherein said first photoresist type is opposite to said second photoresist type.

3. A process for forming a gate of a thin film transistor device according to claim 1, wherein said first photoresist type is a positive type and said second photoresist type is a negative type.

4. A process for forming a gate of a thin film transistor device according to claim 1, wherein said first defocus value is selected in a range of −0.35 µm to −1.2 µm.

5. A process for forming a gate of a thin film transistor device according to claim 1, wherein said second defocus value is selected in a range of −0.35 µm to −1.5 µm.

6. A process for forming a gate of a thin film transistor device according to claim 1, further comprising a step of applying a primer layer on said semiconductor substrate prior to applying said first photoresist layer.

7. A process for forming a gate of a thin film transistor device according to claim 1, further comprising a step of applying a bottom anti-reflection layer on said semiconductor substrate.

8. A process for forming a gate of a thin film transistor device according to claim 1, further comprising a thermal flow step for reducing said first stem portion cavity length after forming said first stem portion cavity.

9. A process for forming a gate of a thin film transistor device according to claim 1, further comprising deposition of a passivation layer with a passivation layer thickness to passivate said thin film transistor device.

10. A process for forming a gate of a thin film transistor device according to claim 1, wherein said head portion cavity is formed to have negative side wall slopes to facilitate lift-off of said gate metal layers.

11. A process for forming a gate of a thin film transistor device according to claim 1, further comprising a step of forming a thin third photoresist layer having a third photoresist type and a third photoresist developing sensitivity on said second photoresist layer after application and soft baking of said second photoresist layer, wherein said third photoresist type is the same as said second photoresist type so that said second photoresist layer and said thin third photoresist layer can be exposed and developed simultaneously, whereas said third photoresist developing sensitivity is smaller than said second photoresist developing sensitivity in order to form a third photoresist overhang to facilitate lift-off of said gate metal layers.

12. A process for forming a gate of a thin film transistor device with enhanced mechanical strength and a reduced gate length comprises the steps of:
   forming a first photoresist layer having a first photoresist layer thickness and a first photoresist type on a semiconductor substrate and performing a first soft baking of said first photoresist layer;
   exposing said first photoresist layer to a first light source through a first mask having first mask patterns with a selected first defocus value;
   performing a first post exposure baking of said first photoresist layer, developing and rinsing to form a first stem portion cavity having rounded top edges and a first stem portion cavity length in said first photoresist layer;
   performing a first hard baking of said developed first photoresist layer;
   applying a first feature shrinking layer having a first feature shrinking layer thickness on said first photoresist layer;
   carrying out a first shrinking diffusion bake for said first feature shrinking layer to allow acid in said first photoresist layer to diffuse into a portion of said first feature shrinking layer and to form a diffused feature shrinking layer having a diffused feature shrinking layer thickness;
   performing a feature shrinking layer development to remove unaffected portion of said first feature shrinking layer, forming a second stem portion cavity having a second stem portion cavity length substantially smaller than said first stem portion cavity length;
   rinsing and baking;
   performing a first plasma hardening treatment of said diffused feature shrinking layer;
   forming a second photoresist layer having a second photoresist layer thickness, a second photoresist type and a second photoresist developing sensitivity on said diffused feature shrinking layer and performing a second soft baking of said second photoresist layer;
   exposing said second photoresist layer to a second light source through a second mask having second mask patterns with a selected second defocus value;
   performing a second post exposure baking of said second photoresist layer, developing and rinsing to form a head portion cavity in said second photoresist layer;
   performing a second hard baking of said developed second photoresist layer;
   depositing gate metal layers by a vacuum deposition method;

lifting off of gate metal layers on said second photoresist layer and removing said first photoresist layer and said second photoresist layer; and rinsing and baking of said semiconductor substrate to complete fabrication of said gate.

13. A process for forming a gate of a thin film transistor device according to claim 12, further comprising a first thermal flow step after said first plasma hardening treatment of said diffused feature shrinking layer, forming a third stem portion cavity with a third stem portion cavity length less than said second stem portion cavity length.

14. A process for forming a gate of a thin film transistor device according to claim 12, wherein said first photoresist type is opposite to said second photoresist type.

15. A process for forming a gate of a thin film transistor device according to claim 12, wherein said first photoresist type is a positive type and said second photoresist type is a negative type.

16. A process for forming a gate of a thin film transistor device according to claim 12, wherein said first defocus value is selected in a range of −0.35 µm to −1.2 µm.

17. A process for forming a gate of a thin film transistor device according to claim 12, wherein and said second defocus value is selected in a range of −0.35 µm to −1.5 µm.

18. A process for forming a gate of a thin film transistor device according to claim 12, further comprising a step of applying a primer layer on said semiconductor substrate prior to applying said first photoresist layer.

19. A process for forming a gate of a thin film transistor device according to claim 12, further comprising a step of applying a bottom anti-reflection layer on said semiconductor substrate.

20. A process for forming a gate of a thin film transistor device according to claim 12, further comprising a passivation layer with a passivation layer thickness to passivate said transistor device.

21. A process for forming a gate of a thin film transistor device according to claim 12, wherein said head portion cavity is formed to have negative side wall slopes to facilitate lift-off of said gate metal layers.

22. A process for forming a gate of a thin film transistor device according to claim 12, further comprising a step of forming a thin third photoresist layer having a third photoresist type and a third photoresist developing sensitivity on said second photoresist layer after application and soft baking of said second photoresist layer, wherein said third photoresist type is the same as said second photoresist type so that said thin third photoresist layer and said second photoresist layer can be exposed and developed simultaneously, whereas said third photoresist developing sensitivity is smaller than said second photoresist developing sensitivity in order to form a third photoresist overhang to facilitate lift-off of said gate metal layers.

* * * * *